(12) United States Patent
Uht

(10) Patent No.: US 7,555,084 B2
(45) Date of Patent: *Jun. 30, 2009

(54) SYSTEM AND METHOD OF DIGITAL SYSTEM PERFORMANCE ENHANCEMENT

(75) Inventor: Augustus K. Uht, Cumberland, RI (US)

(73) Assignee: The Board of Governors for Higher Education, State of Rhode Island and Providence Plantations, Providence, RI (US)

( * ) Notice: Subject to any disclaimer, the term of this patent is extended or adjusted under 35 U.S.C. 154(b) by 724 days.

This patent is subject to a terminal disclaimer.

(21) Appl. No.: 11/202,656

(22) Filed: Aug. 11, 2005

(65) Prior Publication Data

US 2006/0078076 A1 Apr. 13, 2006

Related U.S. Application Data

(63) Continuation of application No. 10/723,592, filed on Nov. 26, 2003, now Pat. No. 6,985,547, and a continuation-in-part of application No. 09/672,128, filed on Sep. 27, 2000, now abandoned.

(60) Provisional application No. 60/429,736, filed on Nov. 27, 2002, provisional application No. 60/156,219, filed on Sep. 27, 1999.

(51) Int. Cl.
*H04L 7/00* (2006.01)

(52) U.S. Cl. .................. 375/354; 375/376; 375/371; 327/145

(58) Field of Classification Search .................. 375/354, 375/376, 371, 362; 327/46, 141, 144, 155, 327/156, 159, 145; 362/93, 96; 713/400, 713/401, 500, 503, 600, 601
See application file for complete search history.

(56) References Cited

U.S. PATENT DOCUMENTS 4,288,874 A 9/1981 Yamada
(Continued)

OTHER PUBLICATIONS

"AMD Power Now™ Technology," product information Advanced Micro Device Sunnyvale, CA USA (2002).
(Continued)

*Primary Examiner*—Phuong Phu
(74) *Attorney, Agent, or Firm*—Connolly Bove Lodge & Hutz LLP

(57) ABSTRACT

The present invention performs a digital computation with a lower than worst-case-required clock period (i.e., a faster clock), and at the same time performs the same computation with a larger, worst-case-assumed, clock period (i.e., a slower clock) on a second system with identical hardware. The outputs from the computations are compared to determine if an error has occurred. If there is a difference in the two answers, the faster computation must be in error (i.e., a miscalculation has occurred), and the system uses the answer from the slower system. In one embodiment, the present invention utilizes two copies of the slower system that each run half as fast as the main system. However, the two copies produce results in the aggregate at the same rate as the main system, which is running at a much faster rate than possible without the invention. Hence the present invention improves performance (e.g., speed), albeit with more hardware. Advantageously, the present invention dynamically adapts to achieve the best performance possible under the actual operating conditions.

25 Claims, 11 Drawing Sheets

U.S. PATENT DOCUMENTS

| | | | |
|---|---|---|---|
| 5,272,391 | A | 12/1993 | Ampe et al. |
| 5,583,893 | A | 12/1996 | Nguyen |
| 5,793,233 | A * | 8/1998 | Kunda et al. ............... 327/145 |
| 6,178,212 | B1 | 1/2001 | Akashi |
| 6,269,135 | B1 * | 7/2001 | Sander ...................... 375/354 |
| 6,275,547 | B1 | 8/2001 | Saeki |
| 6,366,145 | B1 | 4/2002 | Williams et al. |
| 6,396,887 | B1 | 5/2002 | Ware et al. |
| 6,516,006 | B1 | 2/2003 | Walker et al. |
| 6,526,106 | B1 | 2/2003 | Migita |
| 6,711,226 | B1 | 3/2004 | Williams et al. |
| 6,741,668 | B1 | 5/2004 | Nakamura |
| 6,985,547 | B2 * | 1/2006 | Uht ............................ 375/354 |

OTHER PUBLICATIONS

"Mobile Intel® Pentium® III Processors Intel SpeedStep® Technology," product information available from http://www.intel.com, Intel Corporation Santa Clara, CA USA (2004).

Austin et al. "Making Typical Silicon Matter with Razor", IEEE Computer pp. 57-65, Mar. 2004.

Burd et al., "A Dynamic Voltage Scaled Microprocessor System," IEEE Journal of Solid-State Circuits 35:1571-1580 (2000).

Ginosar, "Adaptive Synchronization" proceedings of the IEEE International Conference on Computer Design (ICCD), Oct. 1998 (1988).

Kuroda et al, "Variable Supply-Voltage Scheme forLow-Power High-Speed CMOS Digital Design," IEEE Journal of Solid-State Circuits 33:454-462 (1998).

Merchant, et al. "Analysis of a control mechanism for a variable speed processor," IEEE Transactions on Computers 45:793-801 (1996).

Olivieri, "A Low-Power Microcontroller with on-Chip Self-Tuning Digital Clock-Generator for Variable-Load Applications," proceedings of the IEEE International Conference on Computer Design Oct. 10-13, 1999 Austin, Texas (1999).

Sjogren et al., "Interfacing synchronous and asynchronous modules within a high-speed pipeline," IEEE Transactions on VLSI Systems 8:573-583 (2000).

Suzuki, "Low Power Adder with Adaptive Supply Voltage," IEEE 21st International Conference on Computer Design Oct. 13-15, 2003 San Jose, California (2003).

Tzartzanis et al., "A 34Word x 64b 10R/6W Write-Through Self-Timed Dual-Supply Voltage Register File," Proceedings of 2002 IEEE International Solid State Circuits Conference (2002).

UHT, "Uniprocessor Performance Enhancement Through Adaptive Clock Frequency Control"; SSGRR 2003w Conference; pp. 1-10. (Published 2003).

* cited by examiner

SYSTEM AND METHOD OF DIGITAL SYSTEM PERFORMANCE ENHANCEMENT

CROSS REFERENCE TO RELATED APPLICATIONS

This application claims priority to U.S. Patent Application Ser. No. 60/429,736, filed Nov. 27, 2002, and is a continuation-in-part application of U.S. Patent Application Serial Number Ser. No. 09/672,128, filed on Sep. 27, 2000, which claims priority to U.S. Patent Application Ser. No. 60/156,219, filed on Sep. 27, 1999, all the aforementioned applications being incorporated by reference in their entireties.

BACKGROUND OF THE INVENTION

The invention relates to the field of digital electronic systems, and in particular to synchronous digital electronic systems.

Computers, including their central processing units (e.g., Intel Pentium), cell phones, microwave ovens and practically every electronic device manufactured today uses digital hardware to operate. Digital circuits that compute a result based solely on the state of the circuits' current inputs are said to be constructed of combinational logic. Combinational systems can be used in many applications, but for any interesting digital system to be realized the system must base its output on both current inputs and the system's prior outputs or state.

There are two types of digital systems with "state" to be held in some in a memory device; hence these systems are often referred to as systems with memory. The first type, asynchronous digital systems, change state as soon as an input changes its value. Modeling, designing and verifying asynchronous systems has in practice been found to be extremely difficult, even with modern asynchronous techniques. An advantage of digital systems is that they operate as fast as the logic delays allow.

A second digital system type is a synchronous system, in which the state only changes at times determined by a global system clock (i.e., in synchronism with the clock). For example, consider a Intel Pentium III processor with a basic on-chip (CPU) clock that oscillates 500 million times a second (i.e., 500 MHz); the processor only changes its state at the start of one or more of those oscillations. The synchronous approach facilitates the design, construction and use of digital systems.

However, an inherent difficulty and performance penalty with synchronous systems is that the duration/period of the clock must be large enough to handle worst-case operating conditions and manufacturing tolerances. This period is typically at least two times the length nominally required by the typical (common) operating and manufacturing tolerances. Therefore, the performance of such a digital systems is often half or less than what it would be but for the worst-case.

A digital synchronous system 20 can be represented by a block diagram model illustrated in FIG. 1. The components of the system include combinational logic 22 (CL) and flip-flops or latches (FF) 24. The latches 24 hold the current/present state of the system. Each latch typically stores one bit of information. As known, a flip-flop only changes its contents or state when a clock signal makes a transition. The same clock goes to all the latches. The combinational logic 22 has no clock input or feedback loops: a change in one of its inputs propagates to one or more outputs with a delay due only to electrical circuit and speed-of-light constraints. A latch 24 also has a propagation delay, but from the clock transition to a change in its output.

The system 20 operates by using the combinational logic 22 to compute the Next State (NS) f the system from its present state and the current values of the inputs to the system. The next state is then stored in the latches 24 when the clock transitions, and the process repeats. In order for the system to function properly, the computation must propagate through the combinational logic and appear at the inputs to the latches before the relevant transition of the clock occurs at the latches.

If the exact delays through the logic and latches were known, the clock frequency would be set to the inverse of the sum of the delays, and the system would operate at peak performance (as measured by computations per second). However, the delays are not constant, but vary with differences in the manufacturing process, variations in the power supply voltage, variations in the operating temperature and humidity, as well as other factors. As a result of these variations, and the necessity to guarantee the operation of the digital system in the worst-case situation (e.g., temperature extremes), the clock speed is set to a lower, more conservative value than is necessary in most, typical cases. Consequently, the average user experiences significantly lower performance than is actually necessary.

Therefore, there is a need for a faster synchronous system architecture.

SUMMARY OF THE INVENTION

Briefly, according to an aspect of the present invention, the frequency of a system clock is automatically increased until a system error is detected, then the frequency of the clock is automatically slightly reduced to a value that does not cause system errors.

Briefly, according to another aspect of the invention, the frequency of a system clock is automatically increased until an unacceptable number of errors are detected, and then the frequency of the clock is automatically slightly reduced so the number of detected errors is less than the unacceptable number of errors.

The present invention performs a digital computation with a lower than worst-case-required clock period (i.e., a faster clock), and at the same time performs the same computation with a larger, worst-case-assumed, clock period (i.e., a slower clock) on a second system with identical hardware. The outputs from the computations are compared to determine if an error has occurred. If there is a difference in the two answers, the faster computation must be in error (i.e., a miscalculation has occurred), and the system uses the answer from the slower system.

In one embodiment, the present invention utilizes two copies of the slower system that each run half as fast as the main system. However, the two copies produce results in the aggregate at the same rate as the main system, which is running at a much faster rate than possible without the invention. Hence the present invention improves performance (e.g., speed), albeit with more hardware.

Advantageously, the present invention dynamically adapts to achieve the best performance possible under the actual operating conditions.

In another aspect, the invention comprises a Timing Error Avoidance (TEAtime) system that includes structure that uses extra logic with the delay of the longest path between pipeline registers to test on a cycle-by-cycle basis whether or not the system clock is too fast or too slow. If a signal applied to the input of the delay test logic appears at the output of the test logic within the time of the machine's slowest path, the system will provide a signal to speed up the system clock speed.

Alternatively, if the signal applied to the input of the delay test logic appears at the output of the test logic at a greater time than the machine's slowest path, the system will provide a signal to slow down, minus a safety margin, the system clock speed. Since the characteristics of the delay test logic (delay, etc.) mirrors those of the main logic (they are realized close together on the same chip), the system Clock adapts both to dynamic environmental conditions, including temperature and operating voltage, as well as to statically-varying manufacturing conditions.

These and other objects, features and advantages of the present invention will become apparent in light of the following detailed description of preferred embodiments thereof, as illustrated in the accompanying drawings.

DETAILED DESCRIPTION OF THE INVENTION

Figure 2:
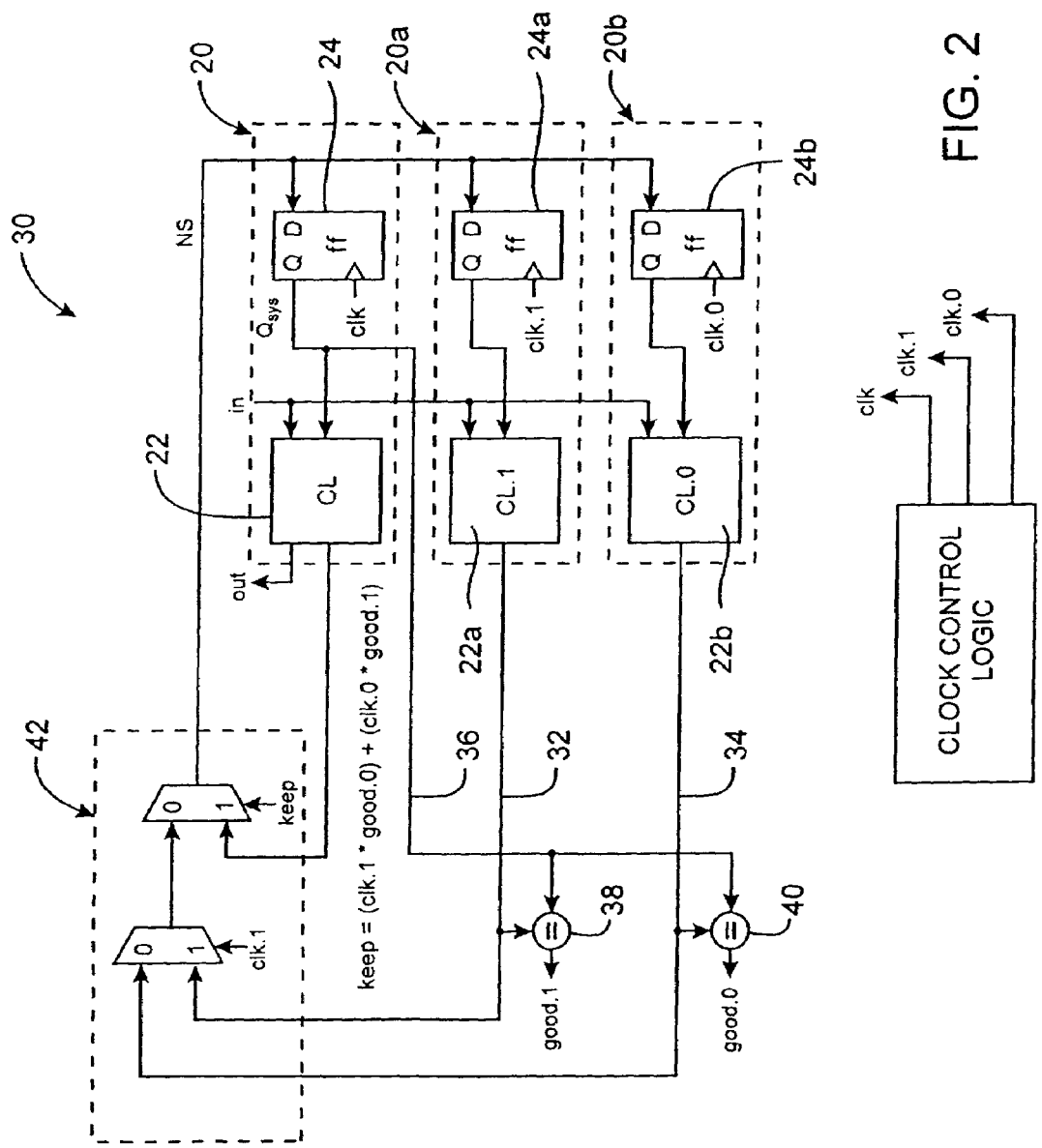
FIG. 2 illustrates a first embodiment of a digital system according to the present invention.

FIG. 2 illustrates a first embodiment of a digital system 30 according to the present invention.

Figure 1:
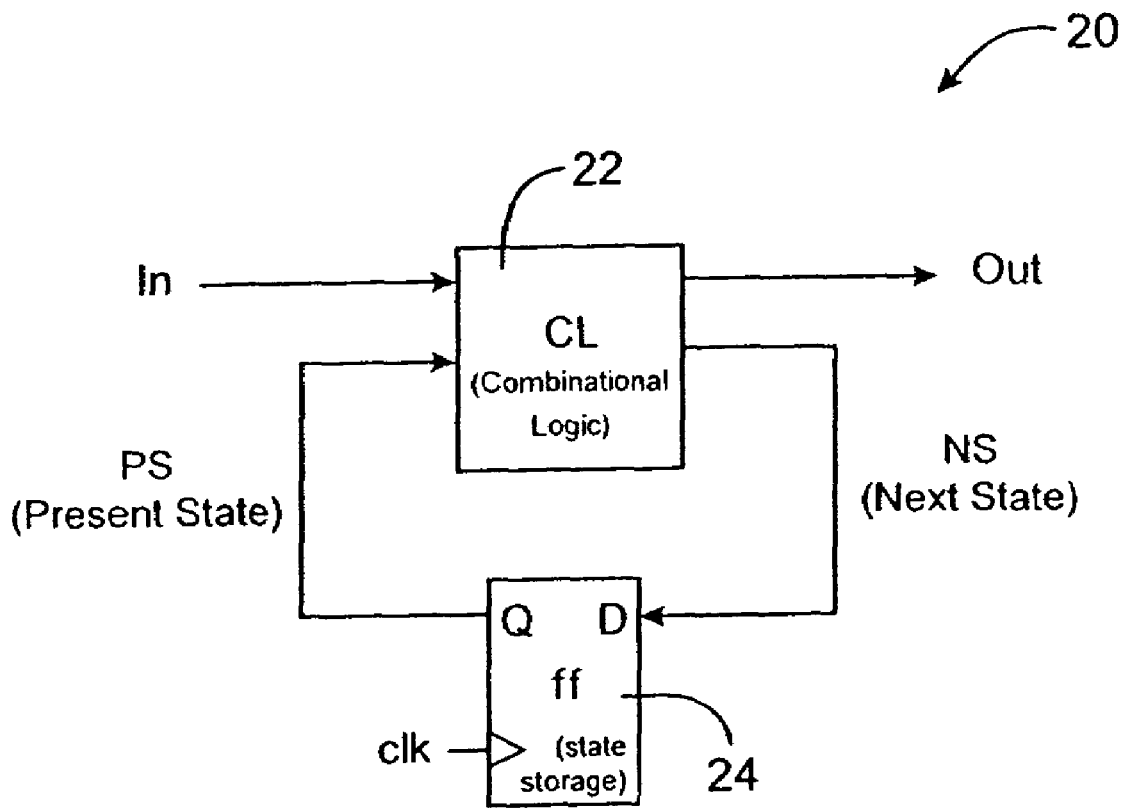
FIG. 1 illustrates a functional block diagram of a digital synchronous system.

The digital system 30 includes two copies 20a, 20b of a main digital synchronous system 20 illustrated in FIG. 1, wherein each of the copies 20a, 20b operates at half the speed of the main digital synchronous system 20. One of the copies replicates the results of the main digital synchronous system 20 in odd cycles, while the other copy replicates the results in even cycles. The two half-speed systems 20a, 20b are operated one main system cycle out-of-sync with each other. Both of the half-speed systems' 20a, 20b outputs on lines 32, 34 respectively are compared with the main system output on the line 36 in alternate cycles using comparators 38, 40. If there is a difference between the two outputs (e.g., between the signals on lines 32 and 36), an error is detected and selection logic 42 selects the output signal from the half-speed system, assuming of course the error was caused by the higher speed system (i.e., system 20). One cycle of operation is lost for every correction necessary; this is referred to as a miscalculation penalty.

Figure 3:
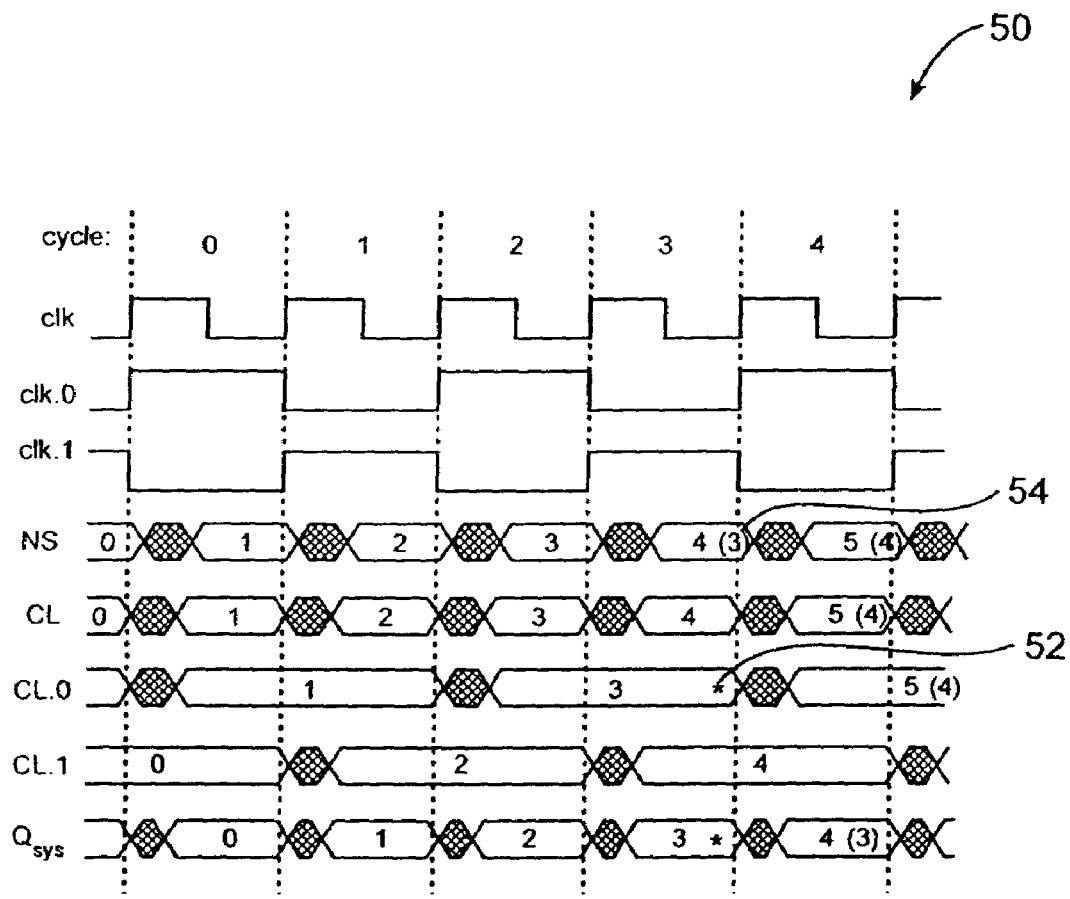
FIG. 3 illustrates a timing diagram for the system illustrated in FIG. 2.

FIG. 3 illustrates a timing diagram for the system 30 illustrated in FIG. 2, the first three cycles of operation (i.e., 0-2) are for the case when no errors occur. The numbers within the individual signal timing charts indicate which computation the signal is working on or holds at that time. At the end of cycle three 52 (at the asterisk), a comparison of the signal CL.0 (half-speed) on the line 34 with the signal Q_sys on the line 36 indicates an error in computation 3. The system 30 then stalls one cycle, with the next state remaining at 3 in cycle 3 (see 54), which it gets from CL.0, having the correct version of computation 3, and the system resumes operation with the correct result. In cycles 3 and later the ideal computation numbers are shown without parentheses, and the actual (with delay) computation numbers are shown with parentheses.

The half-speed systems 20a, 20b must not be operated faster than the original worst-case system speed to help ensure error-free computation to compare the high-speed main computation with. This solution requires approximately three times the hardware of the original system.

It is possible to modify the solution to allow performance increases greater than a factor of two. For each increment of factor increase (e.g., increment of one from 2× to 3×), another copy of the hardware must be used. Further, the slow comparison systems use a clock that is an increment of factor slower, e.g., in the 3× performance increase case, the third-clock system (not shown) operates at a third of the frequency of the main system clock. For each increment of factor increase, the miscalculation penalty increases by a cycle (e.g., for the 3× case the penalty is two cycles). Other cases are handled accordingly. Note that all of the clocks in the overall system are synchronized.

As the frequency increases, the basic performance of the system increases, but at some point the degradation in performance due to the miscalculation penalties from an increasing error rate offsets the basic (clock rate) performance, decreasing the overall performance. Therefore, the system 30 determines the maximum performance point, and adapts to changing conditions to determine the best performance given the actual system operating conditions and manufacturing tolerances of the components therein. The system utilizes a control technique to adjust the system clock frequency in real-time. The basic operation of such a system may be biased towards increasing the clock rate, and receive information from the comparators of the timing error detection circuitry. The system clock drives a counter having a clock enable function. The counter is disabled when an error is detected (in the case of our performance doubling example, this is for one cycle per error). Therefore, the overall absolute averaged count rate of the counter is a direct measure of the system's performance; as errors increase, it counts less often, although at a faster rate—the same dynamics as those of the invention's performance.

The smoothed output of the counter is fed back into the system's clock generator, adjusting the frequency of the clock appropriately. If the averaged counter output is low, it increases the clock frequency (and the counter output also increases) until the averaged counter output begins to decrease; the frequency is then incrementally lowered, increasing the counter output, until the output starts to decrease again, at which point the frequency reverses course once again. That is, the frequency of the clock increases while the derivative of the performance (integrated counter output) increases; when the latter decreases, the clock frequency is decreased; when the performance begins to increase again, the clock frequency is once again increased.

The base digital synchronous system 20 (FIG. 2) is duplicated, and the outputs of the two copies 20a, 20b (FIG. 2) are compared every cycle. The clock frequency increases until the copies 20a, 20b (FIG. 2) differ in their results. The system 30 then backtracks to a known good state, and operation resumes.

This technique assumes that given the statistical variations in the manufacture of the two copies 20a, 20b, one copy will fail at a lower frequency than the other. If they both fail at the same time and in the same way, no error will be detected, and the system 30 will malfunction. There are actually cases in which a finite error rate in such a system can be tolerated. For example, if such a DSP device were manipulating an image and failed once during the image, potentially only one pixel of the image out of around a million pixels total would have an incorrect value, and no one would notice.

For mission critical applications this technique would not be suitable. However, the technique may be modified to function with any probability simply by continuing to add copies of the original digital system to the modified system, and comparing all of the outputs. In such a method voting techniques can be used. These systems have been used (e.g., in the Space Shuttle), but to enhance reliability rather than improve performance. Therefore, existing systems may have their performance improved by increasing their clock rate to an acceptable error (tolerated) rate level using the control system technique according to an aspect of the present invention.

This embodiment of the invention was tested using programmable hardware in conjunction with a variable frequency clock generator to provide a piece of combinational logic. Specifically, a 32-bit adder was built using a commercial-off-the-shelf Field Programmable Gate Array (FPGA). The inputs to the 32-bit adder came from registers using the same clock. There were also two registers on the output of the adder. The first was loaded one cycle after the input registers to the adder are loaded with test data. The second was loaded two clock cycles after the inputs were loaded. A comparator compared the outputs of the first and second output registers, hence at times differing by one cycle. Two one-bit registers were on the comparator output, to save (i.e., sample) the comparison output at different times. Therefore, the major basic elements of the invention were modeled. For each event, two random numbers were applied to the inputs of the adder at the same time. The output of the adder was latched both one and two clock cycles later. By adjusting the clock frequency and looking at the output register results, and the comparator results, it was determined when the adder produced correct results, and if correct/incorrect operation was detected by a slower system (i.e., the second register, which gives the adder twice the time to compute its result). The overall system was driven and examined by a host computer, which further verified the additions.

The primary experiment determined the frequency that the system can operate at without error, or rather, with very few (all tolerated) errors. As a base frequency, we used the results of the design tools that indicate the adder (in the system, that is, including register delays) can operate at about 33 MHz (33 million adds per second) assuming worst case conditions. That corresponds to a clock period of about 30 nanoseconds.

The experiment was performed a number of times. Each pass included performing twenty different additions on random numbers at one operating frequency. The system was initialized to a low frequency. The clock oscillator was variable from about 360 KHz to 120 MHz. A host computer sets the frequency, and used a bisection algorithm to quickly find the highest operating frequency with no errors among the twenty additions.

After the first run, the operating frequency was determined to be about 60+ MHz. However, certain aspects of the data indicated that the system may actually be operated faster; the comparator was actually too slow. The experiment was run again allowing the comparator more time to operate (but still looking at the two output registers clocked at the original times). The operating frequency increased to about 95 MHz. Therefore, a factor of approximately three improvement in adder performance was realized.

A problem performing quick additions is the necessity to allow for the carry to propagate from the least significant bit (LSB) to the most significant bit (MSB), in the worst case. However, the worst case rarely happens with random data. Further, although the probability of a carry out of any particular bit is about ½, the probability of having carries propagate over multiple bits decreases exponentially with the number of bits. A typical "maximum" propagation length of 8-9 bits was estimated, and that is almost exactly What we found in the twenty (20) random pairs of addends and augends (adder inputs) of the experiment. Hence, the worst case propagation length of 32-bits (in this case) is no where near seen in typical data, and the output of the adder actually settles in much less time than one might think.

Figure 4:
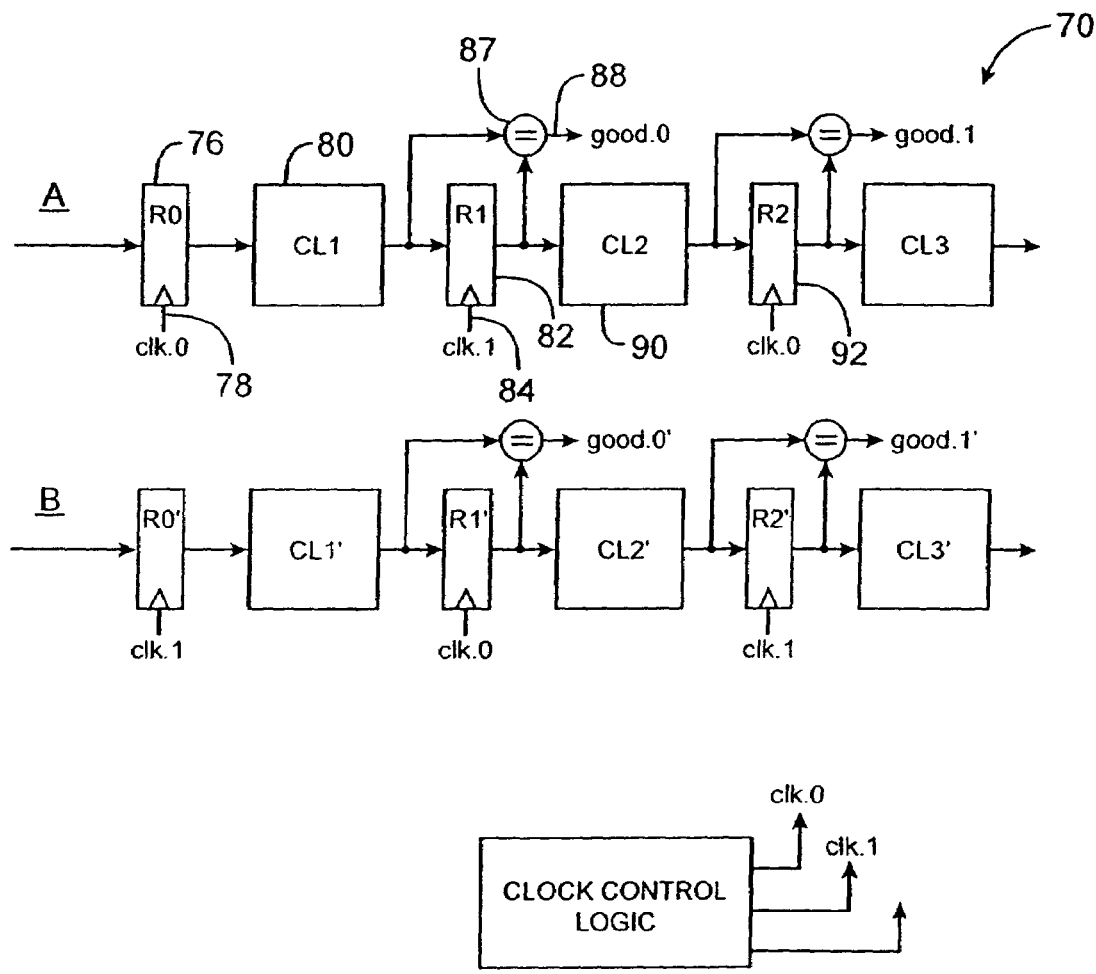
FIG. 4 illustrates a first alternative embodiment of the present invention.
Figure 5:
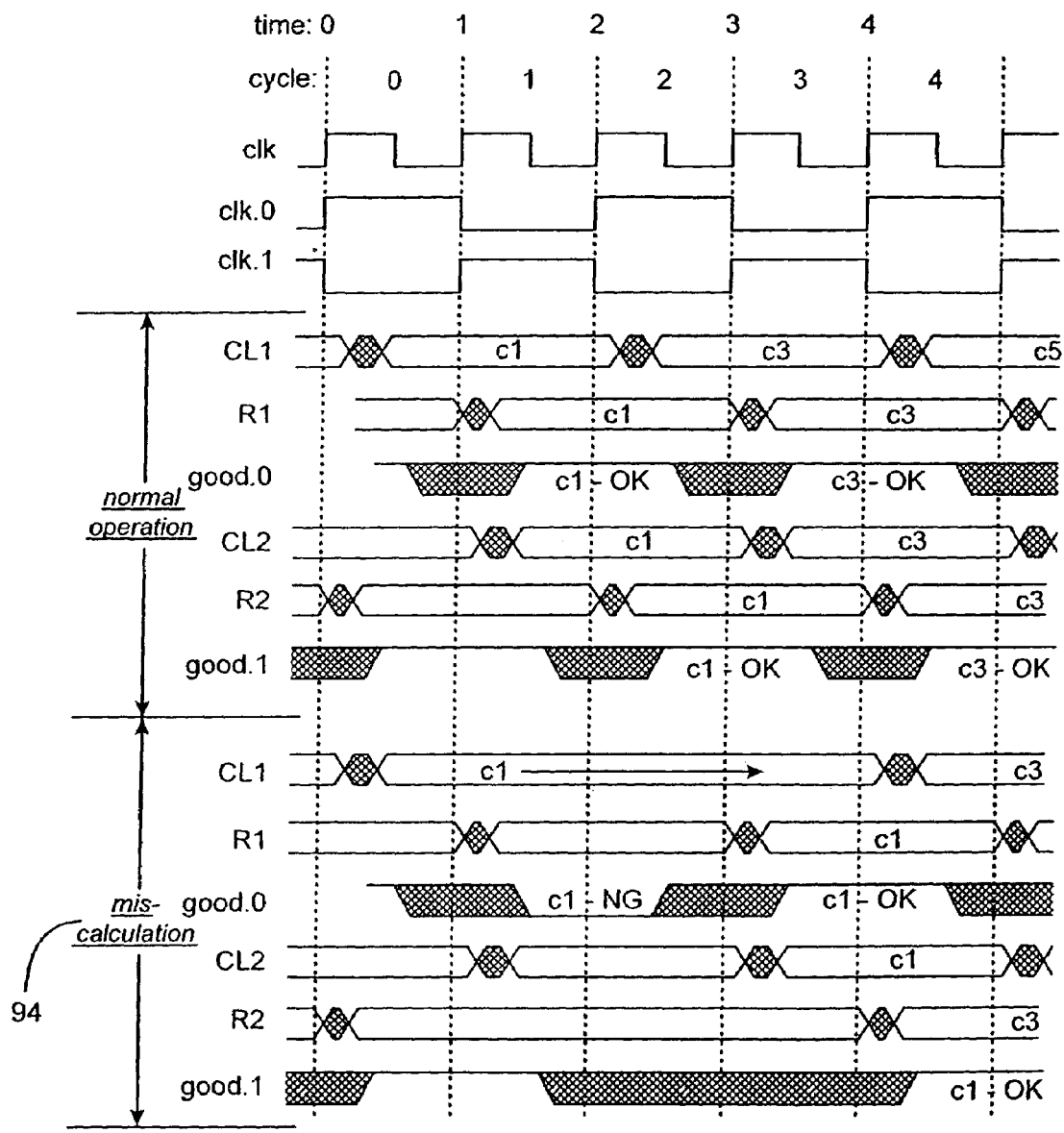
FIG. 5 illustrates a timing diagram for the first alternative embodiment illustrated in FIG. 4.

FIG. 4 illustrates a first alternative embodiment 70 of the present invention. This embodiment may be realized at the gate and latch level or at the register level. The system illustrated in FIG. 4 has a hardware cost that increases at the same rate as the performance (e.g., about 2× hardware cost for 2× performance increase, while the power also increases by a factor of about two). This solution is also easier to build and does not increase the amount of logic (gate delay) in the critical path. This solution is applied at the functional level in a pipelined system. FIG. 5 illustrates a timing diagram for the first alternative embodiment system 70 illustrated in FIG. 4.

For the purposes of describing this embodiment, and certainly not by limitation, it is assumed that the system is pipelined. In a pipelined system (common in today's processors), the work of the original combinational logic is divided up into several sections/stages. Each stage does part of the work of the computation, but at different times. As known, a classic pipelined system operates in the same fashion as an assembly line, i.e., many products are being constructed in the line at any given time, but each is at a different point in the construction process. Although it takes about the same time to perform a single computation, many computations can be in process at the same time, realizing a type of parallelism and thus improving performance.

Referring to FIG. 4, the system 70 includes two identical copies of the original system, adding comparators, and clocking adjacent stages on alternate system clock cycles. The two copies use complementary clocks at corresponding stages. The two half-speed clocks are skewed by one system clock cycle, as shown in FIG. 5. Referring to FIG. 5, the timing diagram illustrates the timing when no errors occur, and also the system timing when an error has been detected at the output of R1, in section A. (FIG. 4).

Referring again to FIG. 4, assume that the hardware illustrated in the diagram is part of the system's overall pipeline (e.g., an Intel Pentium II microprocessor has about twelve stages in its pipeline). Pipelining allows a higher speed clock to be used than otherwise. The primed (') hardware is a copy of the unprimed (top) hardware.

The operation of the system 70 is as follows. Inputs to the overall system come in at the system clock rate. Note that at least as far as this hardware is concerned, there is no actual clock operating at the full rate. The inputs go to each pipeline 72, 74 in alternate cycles. At time 0, an input is latched into latch R0 76 by the signal clk.0 on line 78. The first computation occurs in combinational logic block CL1 80, and is latched one system cycle later at time 1 into latch R1 82 by the signal clk.1 on line 84. The signals clk.0 and clk.1 run at half the rate of the overall system clock.

Therefore, the computation in the combinational logic block CL1 80 as latched in latch R1 82 takes one system cycle. However, block CL1 80 does not have its inputs changed until time 2 (see FIG. 5). At end of the second cycle, the output of latch R1 (one cycle computation time) is compared with the current output of the combinational logic block CL1 (two cycles of computation time, hence the guaranteed correct answer). If the two results, slow one and fast one, are equal the signal good.1 on line 88 is true indicating that the fast computation is correct and no corrective action needs be taken. At time 2 (see FIG. 5) the output of the second computation, from combinational logic block CL2 90, is latched into latch R2 92. Similar operations happen in the rest of the pipeline A stages, as well as in pipeline B. Results leave pipeline A (and B) at a rate one-half of the overall system clock rate, where the system clock rate is twice as fast as the system clock rate without the invention.

However, there are two pipelines, so results are produced at 0.5*2*2=2 times the rate of the original system.

If a miscalculation occurs, we then have the timing of the lower diagram 94 illustrated in FIG. 5. In this case, the latch R1 82 has latched incorrect results from the combinational logic block CL1 80. This is detected at the end of time 2 by comparator 87, which provides a signal value on the line 88 indicating that the signal good.1 is false. Therefore, the combinational logic block CL2 90 also has an incorrect answer, so the signal clk.0 on the line 78 is disabled for all of pipeline A at time 2 (see FIG. 5). The combinational logic block CL1 80 is still computing the same result for inputs IA1, and therefore at time 3 (see FIG. 5) the latch R1 82 latches in the correct result from the combinational logic block CL1 80. The combinational logic block CL1 80 has had more than two cycles to compute its result, which is thus correct. This correct result is now in the pipeline, and normal high-throughput operation resumes. Therefore, pipeline A has suffered a miscalculation penalty of two system clock cycles. Overall, this may lead to a system miscalculation penalty of one cycle, but if we require that the outputs from the two pipelines be in order, pipeline B must also be stalled by two system cycles, and hence we assume the penalty is two cycles for a miscalculation in this embodiment.

If typical delays are one-third the original system's worst-case delays, and we thus would like to improve performance by a factor of three, a third copy of the system would be needed, with three clocks running at a third of the system clock rate, which is itself running three times faster that the original system clock. Note that the power required to operate the new system also increases proportionally to the performance increase. The miscalculation penalty also increases proportionally to three cycles.

An advantage of the system illustrated in FIG. 4 versus the system illustrated in FIG. 2 is that the embodiment in FIG. 4 does not require selection logic (see 42 in FIG. 2), which allows a faster clock, or rather, does not increase the delay through a stage.

Referring still to FIG. 4, inputs to new computations alternate entering pipeline A and pipeline B every cycle. Similarly, the output from the overall system alternates coming from pipeline A and pipeline B every cycle. Also note that as described above, the two pipelines are independent (i.e., a computation in one pipe does not depend on a computation in the other pipe).

Figure 6:
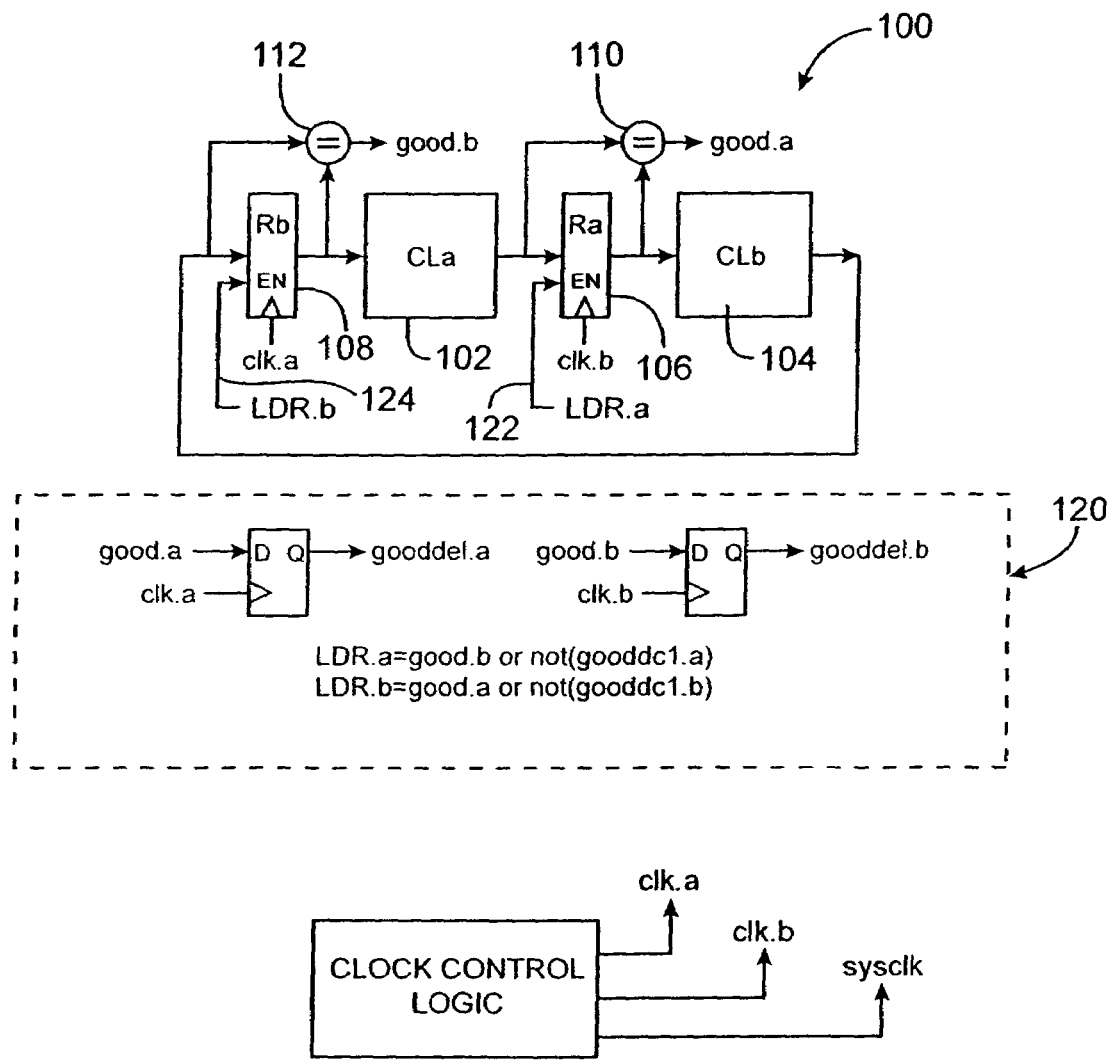
FIG. 6 illustrates a second alternative embodiment of the invention.

FIG. 6 illustrates yet another embodiment 100 of the invention. Notably, the embodiment 100 illustrated in FIG. 6 realizes a 2× performance for less than a 2× increase in hardware cost, while power increases by a factor of four. A major feature of this embodiment is its applicability to all digital systems, via the general digital system model illustrated in FIG. 1.

Referring to FIG. 6, this embodiment is premised on creating a mini-version of a proportional pipe, but constructing the stages' combinational logic in a different manner. Assuming the original combinational logic block CL illustrated in FIG. 2 is split it into two equal-delay combinational logic sections CLa 102 and CLb 104 (i.e., we increase the pipelining by a factor of two). This allows the clock frequency to be doubled, and using a two-phase clocking system the implicit system frequency can be increased by another factor of two. However, since we only get a result every complete pass through the pipeline (i.e., every two implicit system clock cycles), the overall performance increases by a factor of two.

This embodiment splits the combinational logic block 22 illustrated in FIG. 2 into two blocks 102, 104, wherein each block includes its own staging register 106, 108 respectively, as in a pipeline, except the stages are clocked on alternate system cycles. The system 100 also includes comparators 110, 112. The implicit system clock frequency is 4× the original. The explicit (physically existing) stage clock frequencies of the solution are 2× the original system clock frequency, and the same as the new explicit system clock frequency.

The system 100 also includes error handling logic 120 to control the unit and handle errors. The error handling logic generates a signal LDR.a on line 122, which is the synchronous load enable line for the register Ra 106. The register Ra 106 is loaded when the signal LDR.a on the line 122 is true and the register Ra's clock goes from 0 to 1. Therefore, the register is loaded when either there was an error out of the combinational logic block CLa 102, and the logic block CLa needs more time to compute its result, or when the prior stage produced a valid result without extra delay. The technique for generating the signal LDRb on line 124 within the error handling logic is similar.

Figure 7:
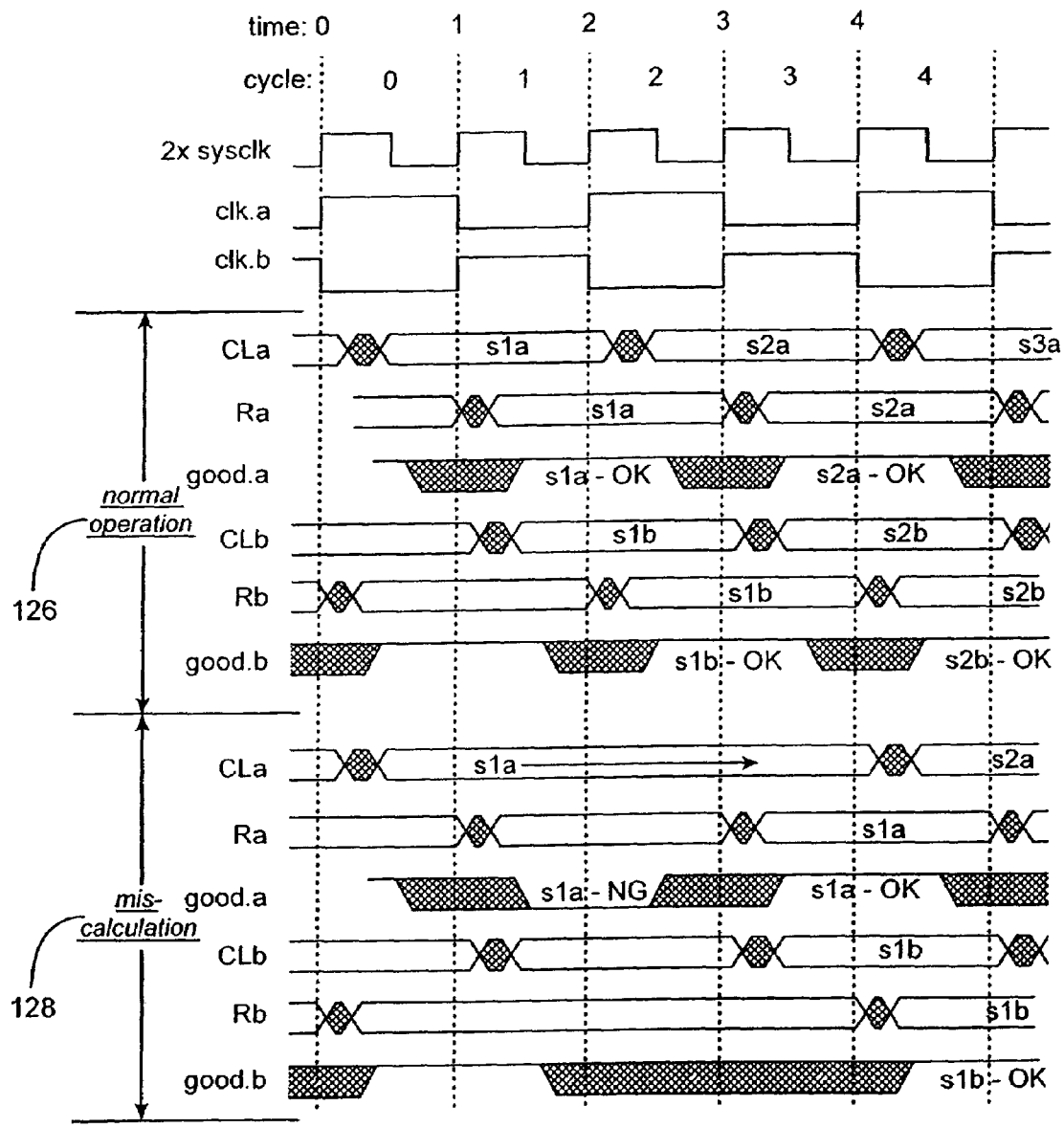
FIG. 7 illustrates a timing diagram for the embodiment illustrated in FIG. 5.

FIG. 7 illustrates a timing diagram for the embodiment illustrated in FIG. 5. Notably, the two half-speed clocks clk.a and clk.b are skewed by one implicit system clock cycle. The explicit system clock is the same as the signal clk.a. The top diagram 126 (FIG. 7) illustrates the timing when no errors occur, while bottom diagram 128 illustrates the timing when an error has been detected at the output of the latch Ra 106 (FIG. 5). The nomenclature: "s1a" indicates that state 1, part a (the first half of the original state) is being computed.

As with the embodiment illustrated in FIG. 4, the performance of the system illustrated in FIG. 6 can be increased by increasing the number of sections of the system. For example, to increase the performance by a factor of three, the combinational logic would be split into three sections, each ending in a register clocked by one distinct phase of a three-phase clock.

A base 32-bit adder would require the same overall combinational logic (combinational adder itself) and at least two 32-bit registers for the inputs (64-bits of registers total), and in some cases an additional 32-bit register for the output, although in a pipelined system the output register would be counted as part of the next stage. An adder based upon the embodiment in FIG. 6 would use 92-bits of registers and three ten- or eleven-bit comparators. Making a rough assumption that one-bit of comparator costs the same as a one-bit register, the total hardware cost for the embodiment illustrated in FIG. 6 125-register-bit equivalents.

Figure 8:
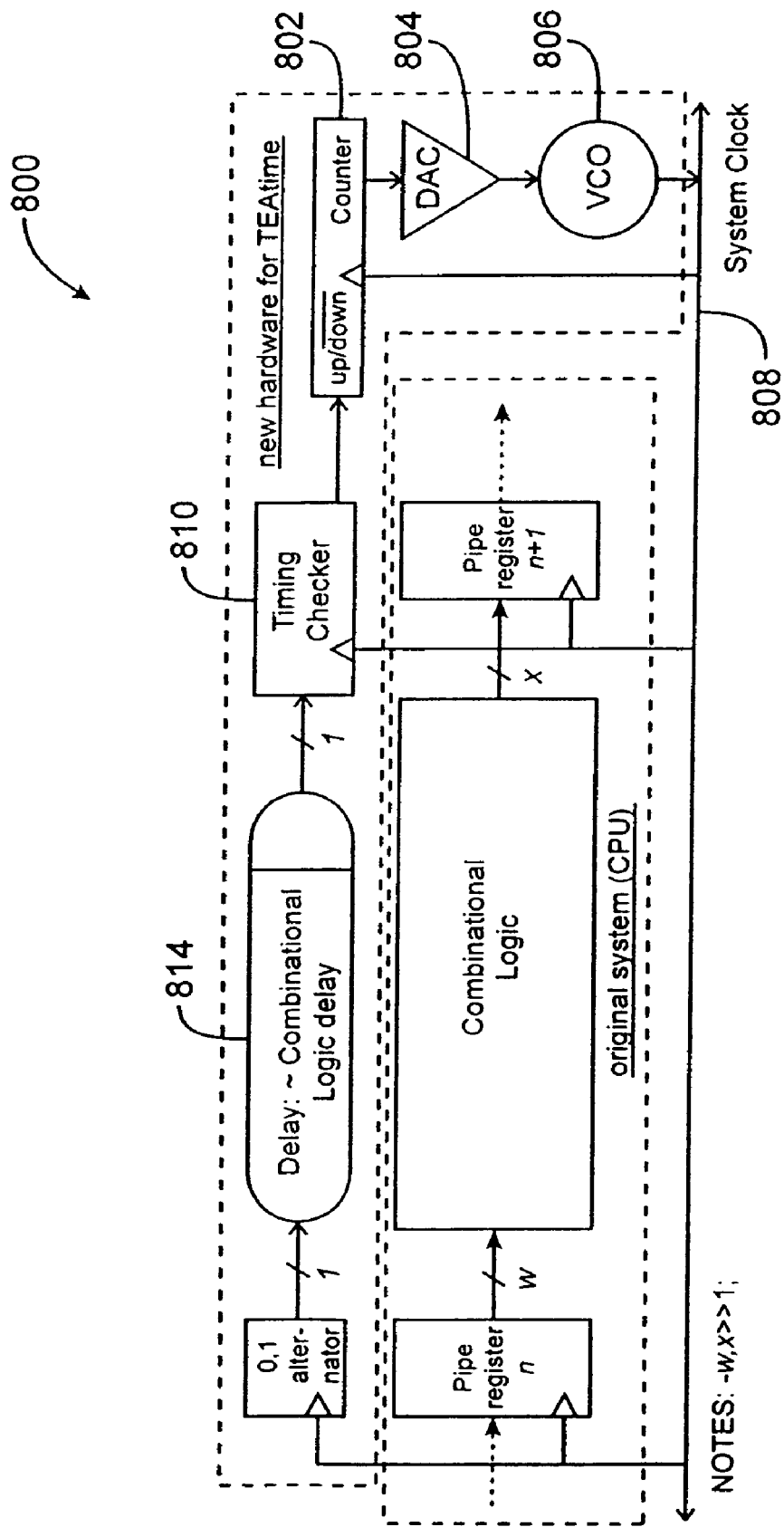
FIG. 8 illustrates a block diagram of a timing error avoidance system.

A timing error avoidance system 800 is shown in FIG. 8 and comprises standard logic and analog element, an up/down counter 802 to drive a digital-to-analog converter (DAC) 804, which in turn generates an analog voltage to drive a VCO 806 that sets the frequency of the system clock on a line 808. In the example system, the counter 802 is always changing, and by at most one, up or down. With advances in VLSI technology, all of these elements should be realizable on the same chip as the system. Note that since there is an explicit feedback loop from the system clock to the counter's setting, the absolute value of the counter 802 is not important, only that it be able to go up and down in response to commands from the timing checker 810.

The timing error avoidance system 800 is constructed by determining the critical path between register elements within a digital machine. For example in a pipelined CPU, this includes determining the slowest (clock-period determining) stage, and the critical (longest, time-wise) path through that logic and constructing a one-bit wide version of that logic in which a change at the one-bit version's input from a logic 0-to-1 or a 1-to-0 propagates all the way through to the end of the logic. This delay test logic is not connected to any of the regular logic of the machine. However, the delay test logic nominally has the same delay as the worst case path through the machine. Drive the delay test logic 814 with alternating 1's and 0's, the latter synchronized with the system clock on the line 802. The location of this test input corresponds to the output of the beginning pipeline register of the slowest pipeline stage in a CPU. At the end of every cycle, if the test data has not reached the output register of the pipeline stage before the system Clock edge, then the system is operating slower than it might, and the system Clock frequency is increased. If, however, the test data has reached the output register, then the system Clock frequency is getting close to the system's limit, and thus the system Clock frequency is reduced.

Figure 9:
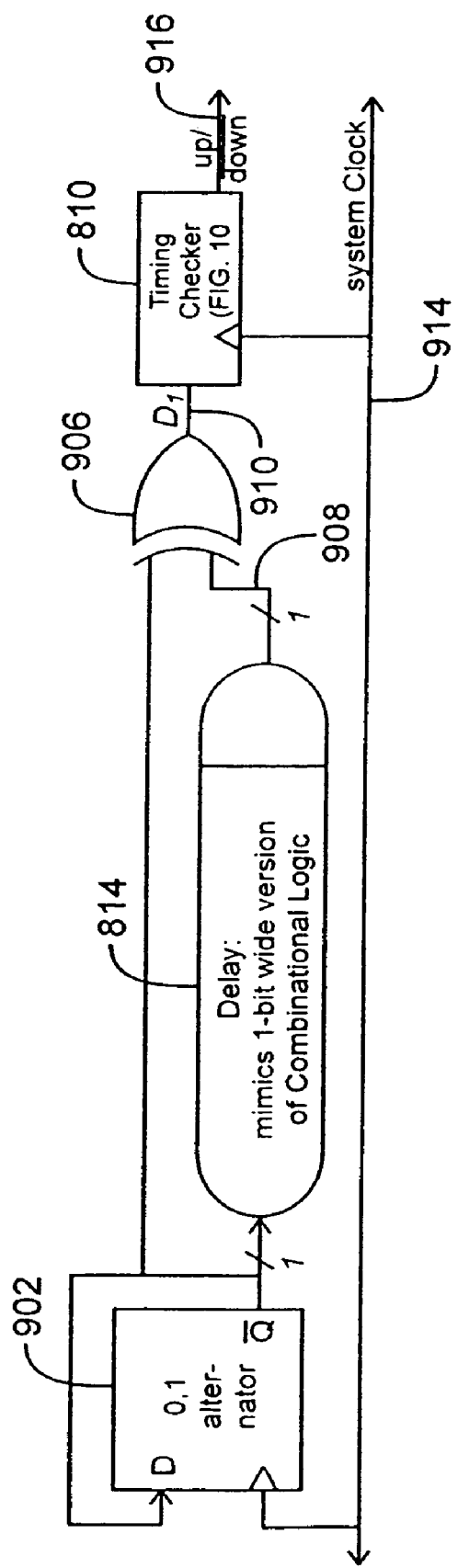
FIG. 9 is a more detailed block diagram illustration of the timing error avoidance system illustrated in FIG. 8.

In order to show the simplicity of the main timing error avoidance circuitry, we provide low-level details of its realization in FIG. 9. The alternating 1's and 0's are created by a flip-flop 902 wired for toggle operation. The delay test logic 814 includes a one-bit slice through an address multiplexor, the CPU's register file, the bypass multiplexor used for operand forwarding in the CPU to reduce data dependencies, and a zero-detecting comparator across the data path width.

An exclusive-OR gate 906 normalizes delayed signal on line 908 to present a signal on line 910 to timing checker 810 with the same polarity regardless of the output of the toggle flip-flop 902. The delay of the delay test logic 814 is adjusted at system design time to be slightly greater than that of the aforementioned critical path to give a suitable safety margin. This is a relatively simple procedure when a high-quality logic simulator is used in the design process. In the case of our example CPU system a structural simulation was performed on the CPU running the test program. From this simulation, we obtained both the worst-case operating frequency for a non-timing error avoidance (baseline) CPU, and checked the performance of the timing error avoidance logic to ensure that the system clock frequency was reduced before the timing constraints of the regular CPU logic were violated. This ensured timing error avoidance.

There is one place in the timing error avoidance system illustrated in FIG. 9 where system failure can occur—this is at the start of the timing checker 810, where the delayed signal is latched into a flip-flop. Since the delayed signal can be positioned anywhere in time, and is not synchronized with the system clock on line 914, there is the possibility that the delayed test signal could change value at the same time as the signal is being latched in the timing checker 810. This may result in metastability at the output of the timing checker 810, in which the physical value of the logic output signal on line 916 of the timing checker flip-flop is neither 0 or 1. It is well known that metastable signals can stay in this state indefinitely, leading of the value by the rest of the system logic.

Figure 10:
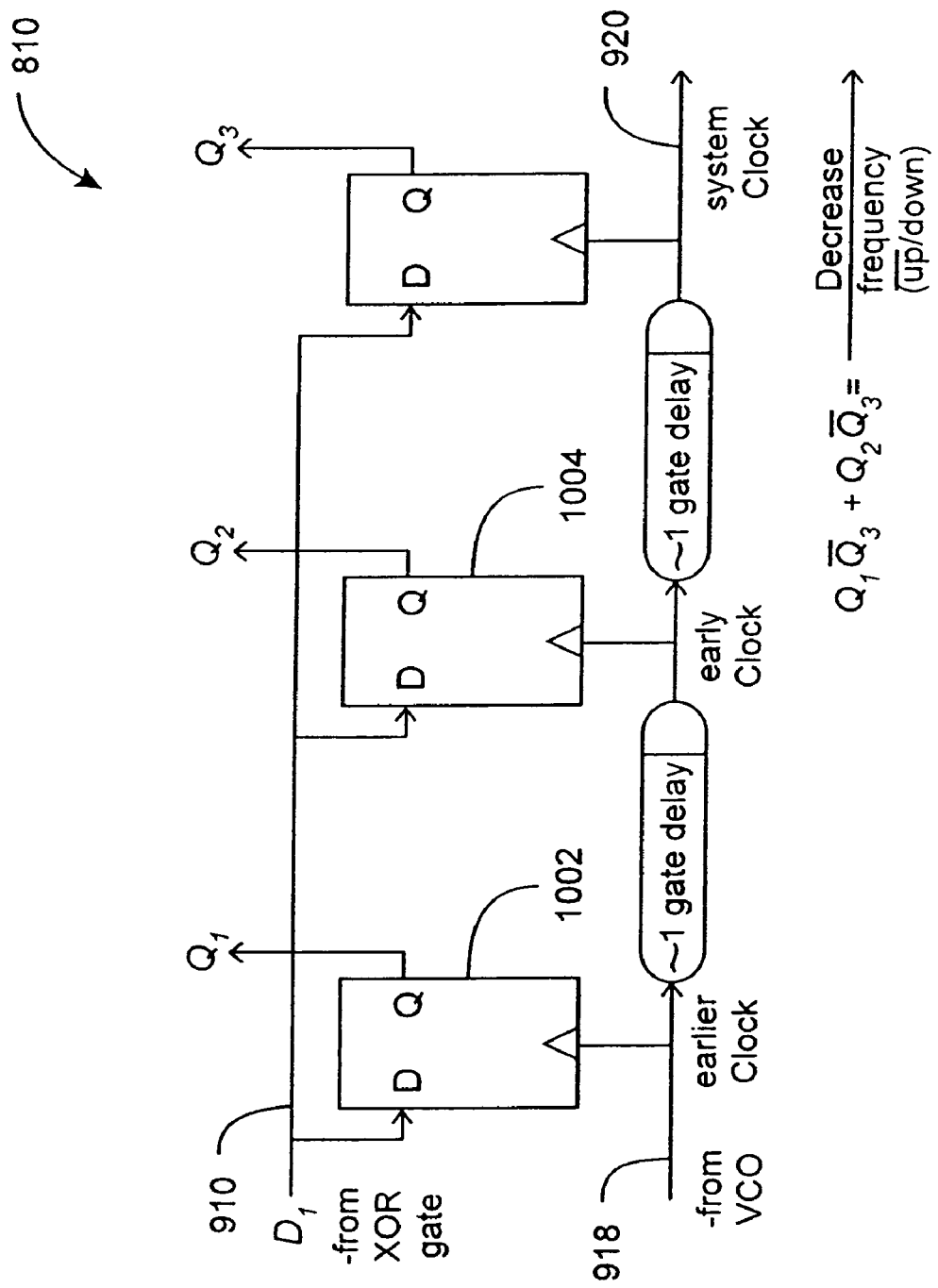
FIG. 10 is a block diagram illustration of the timing checker circuit illustrated in FIG. 9.
Figure 11:
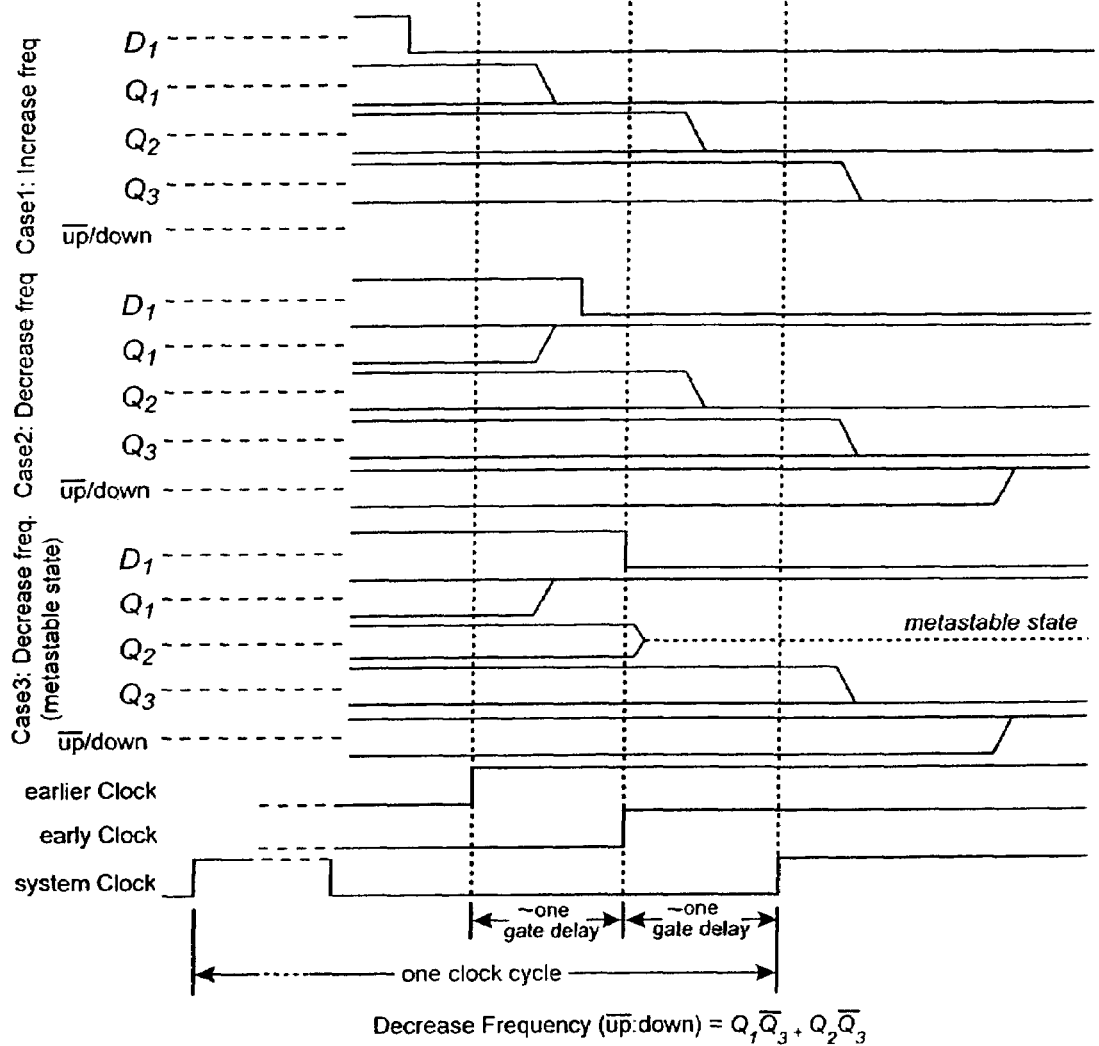
FIG. 11 illustrates a timing diagram for the embodiment illustrated in FIG. 10.

FIG. 10 illustrates an embodiment of the timing checker circuit 810 that addresses raised in the preceding paragraph. The timing check circuit 810 samples the delay test signal D1 on line 910, at two different times. Then, for a single cycle, only one of flip-flops Q1 1002 or Q2 1004 can possibly be in a metastable state. That is, flip-flops 1002, 1004 cannot both be metastable in the same cycle, since the delay test signal on the line 910 only changes value at most once in a cycle. The output of the logic looking at flip-flip Q1 1002 and flip-flop Q2 1004 to determine up or down clock frequency changing is only sampled long after a metastable condition can begin, as long as the frequency change increment is kept suitably small. The timing checker logic ensures that no metastable condition propagates past the sample point. For example, see FIG. 11 case 3, for an example of the handling of a metastable condition. Cases 1 and 2 show more typical frequency increasing and decreasing, respectively.

As shown in FIG. 10, a signal from the VCO is input on line 918. This signal is input to two serial gate delays to generate the system clock on line 920.

The timing error avoidance logic is relatively inexpensive. For example, for a 32-bit CPU the hardware cost of the delay test logic is less than 1/32 of the cost of the slowest pipeline stage. The variable frequency oscillator adds only a small cost.

If a CPU or other digital system has two or more pipeline stages of similar delay, they can all be treated as described herein for the single stage case, with a "decrease Clock frequency" signal from any of them having priority for the setting of the Clock frequency.

Although the present invention has been shown and described with respect to several preferred embodiments thereof, various changes, omissions and additions to the form and detail thereof, may be made therein, without departing from the spirit and scope of the invention.

What is claimed is:

1. An apparatus comprising:
   a first digital synchronous system configured to be coupled to first clock signal having a first clock signal frequency and an input signal, and to provide a first output signal;
   a second digital synchronous system, substantially identical to said first digital synchronous system, wherein said second digital synchronous system is configured to receive a second clock signal having a second clock signal frequency, that is an integer fraction of the first clock signal frequency, and the input signal, and is configured to provide a second output signal;
   a third digital synchronous system, substantially identical to said first digital synchronous system, wherein said third digital synchronous system is configured to receive a third clock signal having a third clock signal frequency, that is substantially the same as the second clock signal frequency, and the input signal, is configured to provide a third output signal; and
   comparison and selection logic configured to be coupled to said first, second and third output signals to determine if a fault has occurred in the computation of said first output signal and configured to select a system output signal based on whether or not a fault has occurred.

2. The apparatus according to claim 1, wherein said comparison and selection logic is configured to provide a system output signal indicative of said first output signal if a fault has not occurred.

3. The apparatus according to claim 1, wherein said comparison and selection logic is configured to provide said system output signal indicative of said second output signal or said third output signal if a fault has occurred.

4. The apparatus according to claim 1, wherein, for each cycle of said first clock signal, said comparison and selection logic is configured to compare said first output signal to an output signal selected from the group consisting of said second output signal and said third output signal, to obtain a comparison result.

5. The apparatus according to claim 4, wherein said comparison and selection logic is configured to provide a control signal based on said comparison result, and wherein the control signal is configured to select one of said output signals as an overall output signal.

6. A method of improving performance of a synchronous digital system, comprising:
   dividing a logic block of the synchronous digital system into an integer number of logic sub-blocks;
   for each of said logic sub-blocks, coupling an input of a respective register to an output of the logic sub-block;
   for each of said logic sub-blocks and respective registers, comparing an output of the logic sub-block and an output of its respective register to obtain a comparison result;
   clocking different ones of the respective registers using different phases of a multi-phase clock signal having a number of phases equal to said integer number,
   controlling clocking of at least one of said respective registers based on at least one of said comparison results.

7. The method according to claim 6, wherein said controlling clocking comprises delaying clocking of all of said respective registers if one of said comparison results reflects a mismatch between respective outputs associated with that comparison result.

8. The method according to claim 6, wherein the multi-phase clock signal has a frequency proportional to a clock frequency of the synchronous digital system.

9. The method according to claim 8, wherein the multi-phase clock signal has a frequency that is also proportional to said integer number.

10. The method according to claim 6, further comprising:
    delaying clocking of at least one register of a parallel synchronous digital system if one of said comparison results reflects a mismatch between respective outputs associated with that comparison result.

11. An apparatus comprising:
    a combinational logic subsystem of a synchronous digital system, wherein the synchronous digital system has a clock signal configured to operate at a system clock frequency, the combinational logic subsystem comprising:
    an integer number of logic blocks;
    a number of respective registers equal to said integer number, each configured to be coupled to an output of each of said logic blocks; and
    a number of respective comparison blocks equal to said integer number, each configured to be coupled to an output of one of said logic blocks and to an output of the respective register that is configured to be coupled to the particular logic block, the comparison blocks being further configured to control a clock delay based on a comparison result,
    wherein each of said respective registers is configured to be clocked by a different phase of a multi-phase clock signal having a number of phases equal to said integer number.

12. The apparatus according to claim 11, wherein the multi-phase clock signal is configured to have a frequency proportional to said system clock frequency.

13. The apparatus according to claim 12, wherein the multi-phase clock signal is configured to have a frequency that is also proportional to said integer number.

14. The apparatus according to claim 11, wherein clocking of said respective registers is to be delayed if an output of one of said comparison blocks reflects a mismatch between the logic block output and the register output configured to be connected to the comparison block.

15. The apparatus according to claim 11, further comprising:
    a parallel combinational logic subsystem of said synchronous digital system having at least one register, further configured so that clocking of said at least one register is to be delayed if an output of one of said comparison blocks reflects a mismatch between the logic block output and the register output configured to be connected to the comparison block.

16. A synchronous digital system having clock means for synchronously controlling operation of system logic with avoidance of timing error, comprising:
    tracking logic configured to represent a worst case delay path for said system logic;
    signal input means configured to provide logic operation input to said tracking logic;
    a tracking logic monitor configured to monitor for errors in logic operation output of said tracking logic to report faults;
    a frequency-controllable clock in a feedback arrangement with said tracking logic monitor; and
    a servo configured to slow a frequency of said frequency-controllable clock to a clock frequency at which no fault is detected, upon said tracking logic monitor detecting an operation fault in said tracking logic.

17. The system according to claim 16, wherein said servo is configured to increase frequency of said frequency-controllable clock after no fault is detected.

18. The system according to claim 17, wherein said tracking logic includes a time delay component configured to produce an operational safety margin so that a fault will occur in the tracking logic before a fault can occur in the system logic.

19. The system according to claim 17, wherein said signal input means is configured to produce a sequence of digital values including alternating logic one and logic zero.

20. The system according to claim 19, wherein said signal input means is further configured to produce a digital bit stream of alternating logic ones and logic zeros.

21. The system according to claim 16, wherein said tracking logic monitor comprises an exclusive OR logic gate configured to yield a logic transition such that timing alone determines transition to a too fast state and transition to a too slow state.

22. The system according to claim 21, wherein the tracking logic monitor further includes a flip flop configured to control the frequency of the frequency-controllable clock in response to output of said exclusive OR logic gate.

23. An apparatus comprising:
    a combinational logic subsystem of a synchronous digital system, wherein the synchronous digital system has a clock signal configured to operate at a system clock frequency, the combinational logic subsystem comprising:
    an integer number of means for performing combination logic;

a number of respective storage means equal to said integer number, each configured to be coupled to an output of each of said means for performing combinational logic; and a number of respective comparison means equal to said integer number, each configured to be coupled to an output of one of said means for performing combinational logic and to an output of the respective storage means that is configured to be coupled to the particular means for performing combinational logic, the comparison means being further configured to control a clock delay based on a comparison result, wherein each of said respective storage means is configured to be clocked by a different phase of a multi-phase clock signal having a number of phases equal to said integer number.

24. The apparatus according to claim 23, wherein the synchronous digital system is further configured so that clocking of said respective registers is to be delayed if an output of one of said comparison means reflects a mismatch between the output of the means for performing combinational logic and the output of the storage means configured to be connected to the comparison means.

25. The apparatus according to claim 23, further comprising:

a parallel combinational logic subsystem of said synchronous digital system having at least one storage means, further configured so that clocking of said at least one storage means is to be delayed if an output of one of said comparison means reflects a mismatch between the output of the means for performing combinational logic block and the output of the storage means configured to be connected to the comparison block.

* * * * *